United States Patent
Kim

(10) Patent No.: US 7,796,947 B2
(45) Date of Patent: Sep. 14, 2010

(54) DISPLAY SYSTEM AND FM SIGNAL TRANSFERRING METHOD THEREOF

(75) Inventor: Hong Ki Kim, Daegu-si (KR)

(73) Assignee: LG Electronics Inc., Seoul (KR)

( * ) Notice: Subject to any disclaimer, the term of this patent is extended or adjusted under 35 U.S.C. 154(b) by 1016 days.

(21) Appl. No.: 11/369,759

(22) Filed: Mar. 8, 2006

(65) Prior Publication Data

US 2006/0293007 A1 Dec. 28, 2006

(30) Foreign Application Priority Data

Jun. 27, 2005 (KR) .................. 10-2005-0055559

(51) Int. Cl.
*H04B 15/00* (2006.01)

(52) U.S. Cl. .................. 455/62; 455/42; 455/63.3; 348/608; 358/474; 705/75; 709/204; 709/224

(58) Field of Classification Search .................. 455/42, 455/62, 63.3; 348/608; 358/474; 705/75; 709/204, 224

See application file for complete search history.

(56) References Cited

U.S. PATENT DOCUMENTS

| | | | | |
|---|---|---|---|---|
| 4,333,153 | A * | 6/1982 | Mletzko et al. | 358/474 |
| 6,433,835 | B1 * | 8/2002 | Hartson et al. | 348/608 |
| 6,591,085 | B1 * | 7/2003 | Grady | 455/42 |
| 6,983,321 | B2 * | 1/2006 | Trinon et al. | 709/224 |
| 7,333,153 | B2 * | 2/2008 | Hartson et al. | 348/608 |
| 7,512,380 | B2 * | 3/2009 | McGowan | 455/63.3 |
| 2002/0138571 | A1 * | 9/2002 | Trinon et al. | 709/204 |
| 2003/0036357 | A1 * | 2/2003 | McGowan | 455/62 |
| 2005/0283445 | A1 * | 12/2005 | Trinon et al. | 705/75 |

FOREIGN PATENT DOCUMENTS

KR 10-2005-0037616 A 4/2005

OTHER PUBLICATIONS

Chinese Office Action dated Jul. 11, 2008.
Korean Office Action dated Sep. 28, 2006.
Taiwanese Office Action dated Sep. 10, 1998 and English language translation.

* cited by examiner

*Primary Examiner*—Matthew D Anderson
*Assistant Examiner*—April G Gonzales
(74) *Attorney, Agent, or Firm*—KED & Associates, LLP

(57) ABSTRACT

Provided is a display system for transmitting FM signals to an external audio system having an FM reception function. The display system includes: a tuner for receiving an RF signal and dividing the RF signal into a video signal and an audio signal; an audio processor for receiving the audio signal from the tuner; an FM detector for searching usable channels or unused channels among FM frequency bands of a reception area and transmitting information on the unused channels; a microprocessor for setting at least one of the unused channels as an available channel, the unused channels being provided from the FM detector; a memory for storing the available channel under control of the microprocessor; and an FM transmitter for receiving the audio signal from the audio processor and transmitting the audio signal over at least one channel selected among the channels stored in the memory under control of the microprocessor.

15 Claims, 7 Drawing Sheets

Fig. 3
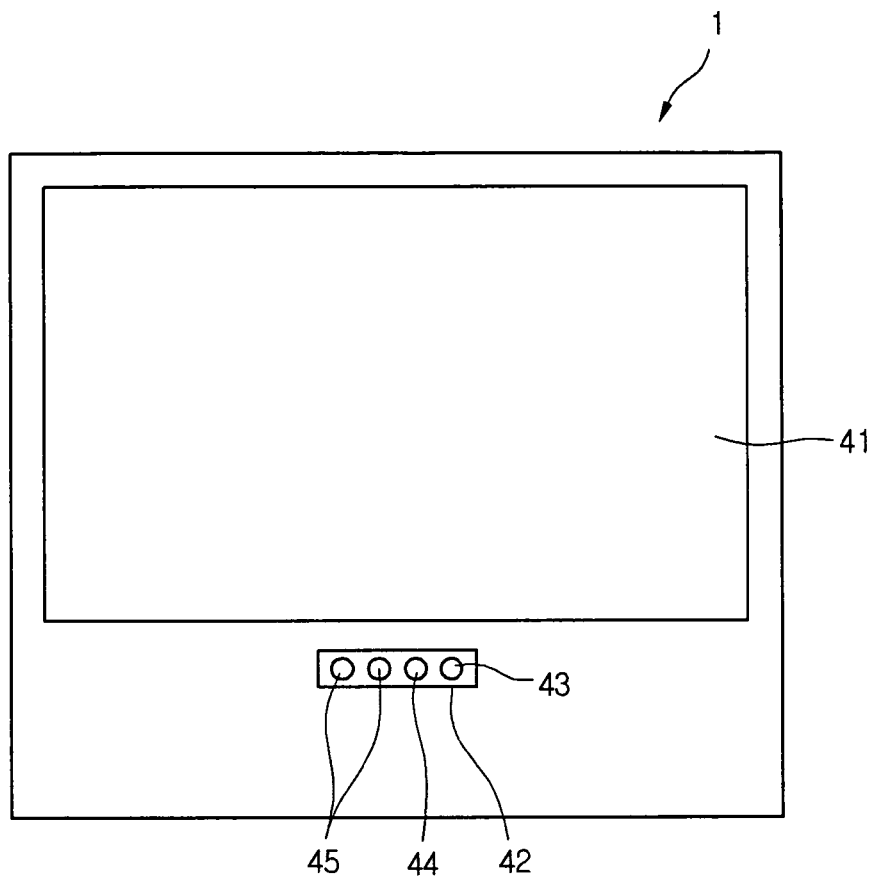
Fig. 4
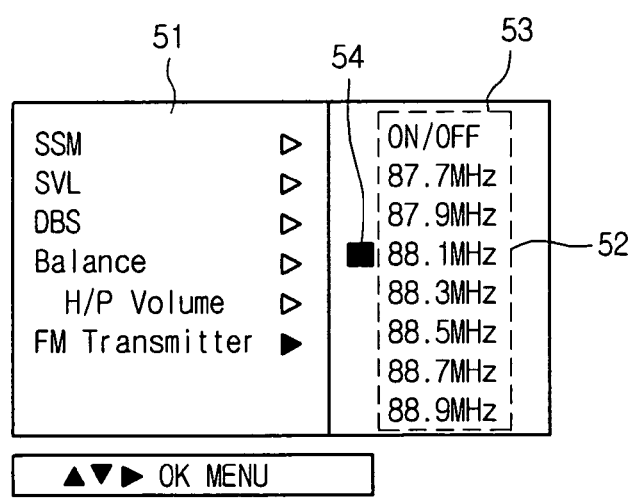
Fig. 5

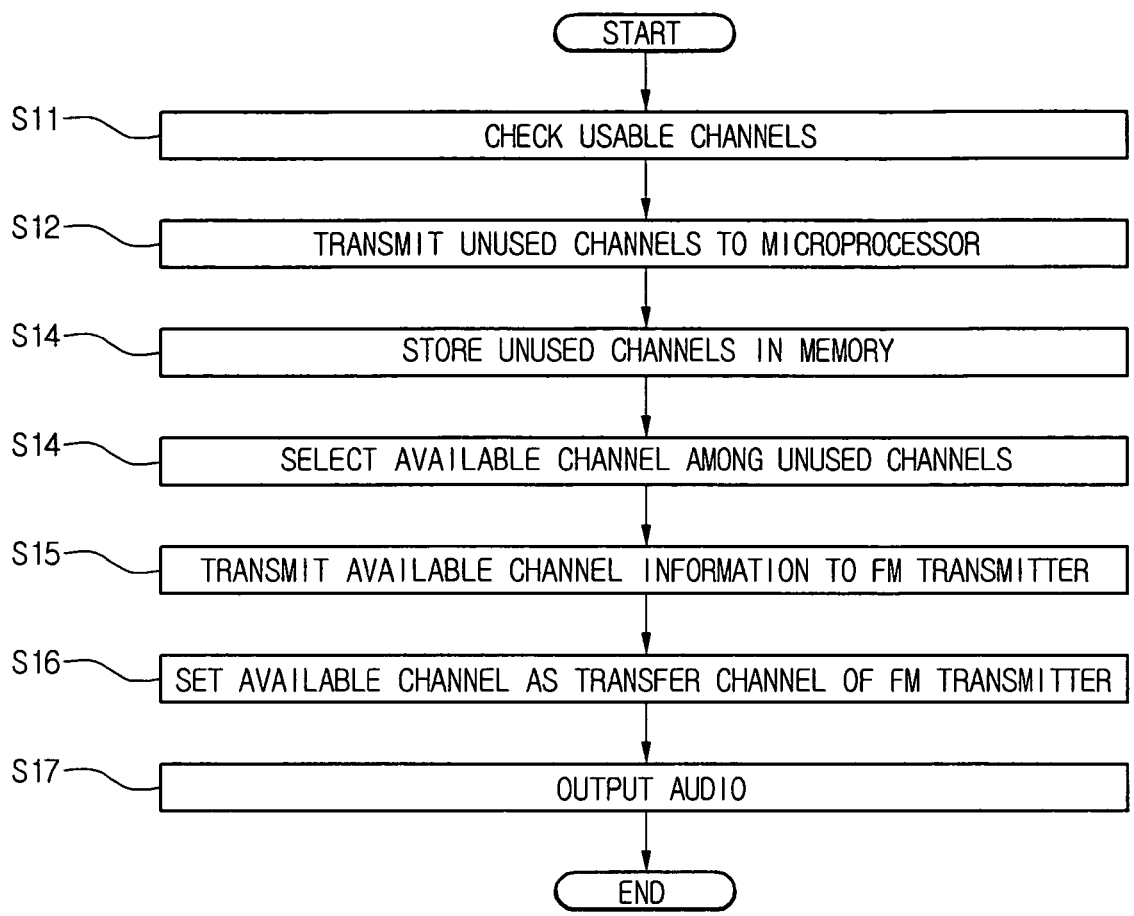

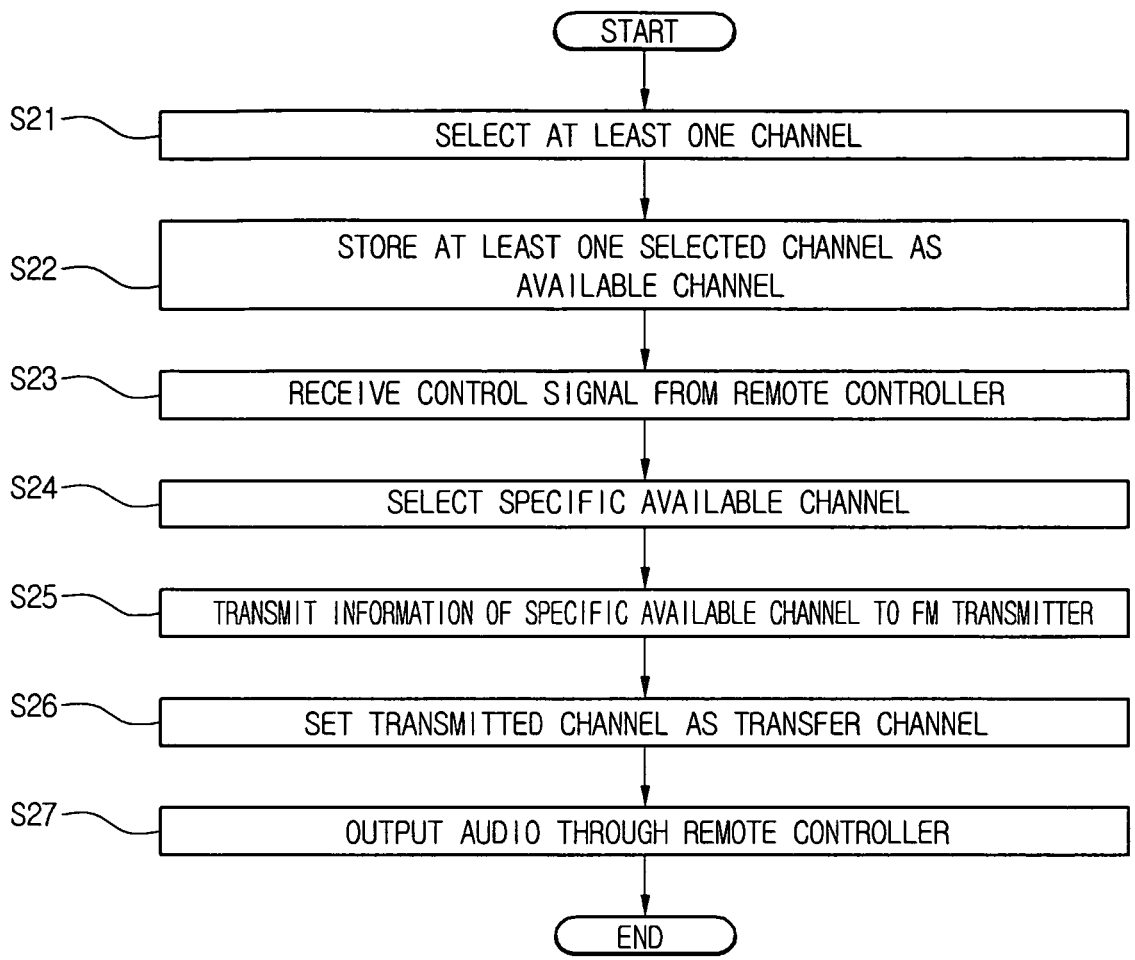

DISPLAY SYSTEM AND FM SIGNAL TRANSFERRING METHOD THEREOF

BACKGROUND OF THE INVENTION

1. Field of the Invention

The present invention relates to a display system, and particularly, to a display system and an FM signal transferring method thereof capable of allowing a user to listen to an audio a wireless way through an external audio system among video and audio reproduced from the display system. More particularly, the present invention relates to a display system and an FM signal transferring method thereof capable of enhancing user convenience and satisfaction by setting exact transmission/reception frequencies when audio signals among a variety of audio/video signals such as RF signals received in the display system are transferred to an external audio system by an FM transmitter.

2. Description of the Related Art

When a sound source reader (e.g., an MP3 player) and an external audio system (e.g., a car audio system) are separated from each other, an FM transmitter transmits audio signals read by the sound source reader to the separate external audio system in a wireless way, thereby allowing a user to listen to the audio in a convenient and comfortable environment.

Since the FM transmitter is a radio-based device, it uses a specific FM frequency. The FM transmitter should use only predetermined frequency bands for nations and regions according to an international agreement regarding the use of radio frequency. Also, general radio broadcasting uses predetermined frequency bands assigned to each nation. Since a frequency band used by radio communication of an FM transmitter interferes with the radio broadcast frequency band, there is a high possibility that the frequency used by the FM transmitter might interfere with the frequency used by the general radio broadcast.

To solve the above problem, the FM transmitter sets available frequency channels and has different frequency channels used for radio communication according to an area where an apparatus is disposed. However, it is very difficult for a user to select a predetermined frequency among the available different frequencies.

To solve this problem, a frequency band capable of avoiding a radio frequency band used in a predetermined region can be set in the FM transmitter in advance, but radio frequency signals include not only a signal of a predetermined frequency used but also a signal in a different frequency band that generates interference with a signal in an original frequency band. Accordingly, such a method is not desirable.

An apparatus such as a display system is disposed inside the building, particularly an interior of room. Therefore, interference between radio signals, signals reflected by the building, and signals of electromagnetic wave due to other electronic devices disposed in the neighborhood of the apparatus are generated much. Therefore, it is problematic to have an apparatus such as a display system disposed in the inside of the building transmit and receive audio signals using a predetermined radio frequency.

SUMMARY OF THE INVENTION

Accordingly, the present invention is directed to a display system and an FM signal transferring method thereof that substantially obviate one or more problems due to limitations and disadvantages of the related art.

An object of the present invention is to provide a display system and an FM signal transferring method thereof capable of allowing a user to listen to audio signals of the display system using other external audio system, not the display system.

Another object of the present invention is to provide a display system and an FM signal transferring method thereof capable of allowing a user to conveniently set and use a frequency through which the display system and an external audio system interface with each other.

A further another object of the present invention is to provide a display system and an FM signal transferring method thereof capable of allowing a user to conveniently use other apparatus disposed together with the display system simultaneously or in cooperation with each other.

A still further another object of the present invention to provide a display system and an FM signal transferring method thereof capable of enhancing user convenience and product reliability even more by allowing a user to set and use a cooperating frequency with only simple manipulation so that a user may conveniently change the frequency when the frequency interference occurs.

Additional advantages, objects, and features of the invention will be set forth in part in the description which follows and in part will become apparent to those having ordinary skill in the art upon examination of the following or may be learned from practice of the invention. The objective and other advantages of the invention may be realized and attained by the structure particularly pointed out in the written description and claims hereof as well as the appended drawings.

To achieve these objective and other advantages and in accordance with the purpose of the invention, as embodied and broadly described herein, there is provided a display system for transmitting FM signals to an external audio system having an FM reception function, the display system comprising: a tuner for receiving an RF signal and dividing the RF signal into a video signal and an audio signal; an audio processor for receiving the audio signal from the tuner; an FM detector for searching usable channels or unused channels among FM frequency bands of a reception area and transmitting information on the unused channels; a microprocessor for setting at least one of the unused channels as an available channel, the unused channels being provided from the FM detector; a memory for storing the available channel under control of the microprocessor; and an FM transmitter for receiving the audio signal from the audio processor and transmitting the audio signal over at least one channel selected among the channels stored in the memory under control of the microprocessor.

In another aspect of the present invention, there is provided a display system for transmitting FM signals to an external audio system having an FM reception function, the display system comprising: an audio input unit for receiving audio signal from an external device; an audio processor for receiving the audio signal from the audio input unit; an FM detector for searching usable channels or unused channels among FM frequency bands of a reception area and transmitting information on the unused channels; a microprocessor for setting at least one of the unused channels as an available channel, the unused channels being provided from the FM detector; a memory for storing the available channel under control of the microprocessor; and an FM transmitter for receiving the audio signal from the audio processor and transmitting the audio signal over at least one channel selected among the channels stored in the memory under control of the microprocessor.

In a further aspect of the present invention, there is provided a display system for transmitting FM signals to an external audio system having an FM reception function, the display system comprising: a tuner for receiving an RF signal and dividing the RF signal into a video signal and an audio signal; an audio processor for receiving the audio signal from the tuner; a memory for storing at least one channel among FM frequency bands of a reception area; a user interface for selecting one channel among at least one or more channels previously stored in the memory by a user; a microprocessor for reading the channel selected from the memory according to the channel selected from the user interface, and setting the read channel as an available channel; and an FM transmitter for receiving the audio signal from the audio processor and transmitting the audio signal over the available channel selected among the at least one or more channels stored in the memory under control of the microprocessor.

In a further aspect of the present invention, there is provided a display system for transmitting FM signals to an external audio system having an FM reception function, the display system comprising: an audio input unit for receiving audio signal from an external device; an audio processor for receiving the audio signal from the audio input unit; a memory for storing at least one channel among FM frequency bands of a reception area; a user interface for selecting one channel among at least one or more channels previously stored in the memory by a user; a microprocessor for reading the channel selected from the memory according to the channel selected from the user interface, and setting the read channel as an available channel; and an FM transmitter for receiving the audio signal from the audio processor and transmitting the audio signal over the available channel selected among the at least one or more channels stored in the memory under control of the microprocessor.

In a further aspect of the present invention, there is provided an FM signal transferring method for use in a display system for transmitting FM signals to an external audio system having an FM reception function, the FM signal transferring method comprising the steps of: a) selecting usable channels or unused channels in FM frequency bands of a reception area; b) transmitting information of the selected unused channels to a microprocessor; c) storing at least one or more unused channels in a memory by using the transmitted information of the unused channels; d) selecting one available channel among the at least one or more unused channels stored in the memory; e) transmitting information of the selected available channel to an FM transmitter; f) selecting a transfer channel of the FM transmitter by using the transmitted information of the available channel; and g) transmitting an audio signal of the display system to the external audio system over the selected transfer channel.

In a further aspect of the present invention, there is provided an FM signal transferring method for use in a display system for transmitting FM signals to a remote controller having an FM signal reception function, the FM signal transferring method comprising the steps of: selecting at least one or more channels in FM frequency bands of a reception area; storing at least one or more channels of the selected channels as available channels in a memory; reading information on one of the available channels stored in the memory according to a control signal outputted from the remote controller; transmitting the read information on the available channel to an FM transmitter; setting a transfer channel of the FM transmitter according to the control signal; and transmitting an audio signal of the display system to the remote controller having the FM signal reception function over the selected transfer channel.

According to the present invention, a user of the display system can use an FM transmitter built in the display system more conveniently and set a frequency more conveniently, so that a user can conveniently set a new frequency any time when a current frequency setting is not correct to listen to broadcasting, which enhances user satisfaction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a front view of a display system according to the present invention:

FIG. 4 is a view of an OSD when an FM transmitter is selected in a display system according to the present invention;

FIG. 5 is a flowchart of an FM signal transferring method in the display system according to the present invention;

FIG. 8 is a flowchart of an FM signal transferring method in a display system according to another embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
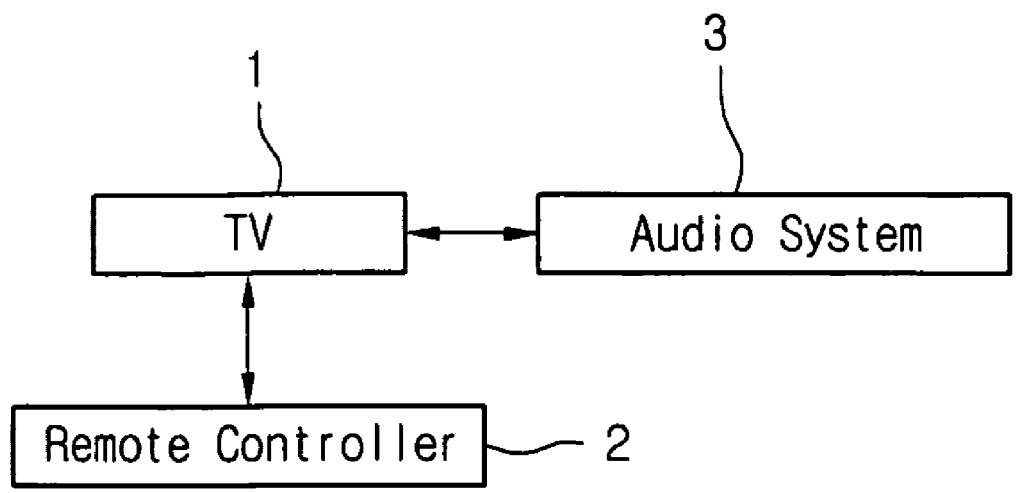
FIG. 1 is a block diagram illustrating a usage of a display system according to the present invention.

FIG. 1 is a block diagram illustrating a usage of a display system according to the present invention.

Referring to FIG. 1, a system of the present invention can includes a display system 1, an external audio system 3, and a remote controller 2. The display system 1 receives RF signals, which are broadcasting signals transmitted from a broadcasting station and transmits received audio signals in the form of radio signals, e.g., FM frequency signals. The audio system 3 receives signals transmitted wirelessly from the display system 1 to output audio.

Also, the audio system 3 and the remote controller 2 have a radio frequency receiver, a built-in speaker, or a speaker-out port therein. Audio signals transmitted from the display system are reproduced by these devices. Of course, it is also possible to reproduce audio signal using the display system itself when audio signals are not transmitted wirelessly by providing a built-in speaker to the display system 1.

Though the display system 1 can be a television to which RF signals are inputted as broadcasting signals, any display device can be used as far as it receives signals from a DVD player generating audio signals, and receives images from a VCR, a set-top box, a PC, a game console, and a camcorder.

Constructions of a display system for controlling a frequency of a radio audio signal that would be transmitted and an external audio system will be described below in detail.

Figure 2:
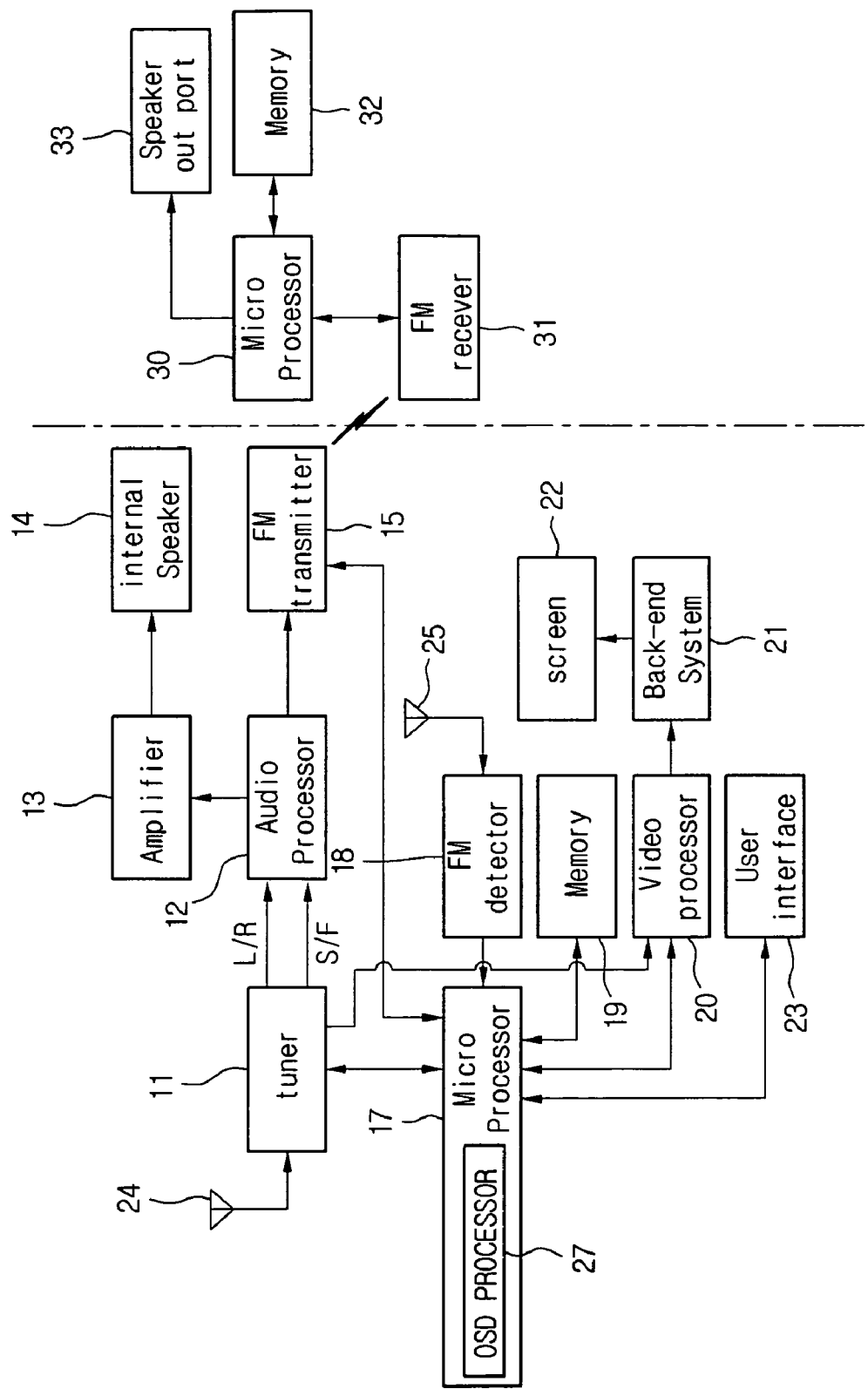
FIG. 2 is a block diagram of a display system according to the present invention.

FIG. 2 is a block diagram of a display system according to the present invention.

Referring to FIG. 2, the present invention includes the display system 1 and an external audio system for receiving and reproducing radio audio signals transmitted from the display system 1. Referring to FIG. 1, the external audio system can be an audio system, a remote controller, or an MP3 player disposed in the neighboring space of the display system.

The display system 1 further includes an RF signal antenna 24 for receiving broadcast signals from a broadcasting station, a tuner 11 for extracting desired signals from the RF signals received in the RF signal antenna 24, an audio signal output block for outputting audio signals among the RF signals extracted by the tuner 11, a video signal output block for outputting video signals among the RF signals extracted by the tuner 11, and a controller (microprocessor) 17.

The RF signal antenna 24 is used when the display system 1 receives signals transmitted from a broadcasting station. On the contrary, when signals outputted from a variety of apparatus such as a DVD player, a VCR, a set-top box, a PC, a game console, or a camcorder are inputted, a separate input port can be readily applied to the display system 1. A part including the RF signal antenna 24 and the input port and receiving audio/video signals from an external apparatus can be generally called an audio input block.

The audio signal output block includes an audio processor 12 for processing audio signals selected by the tuner 11, an amplifier 13 for amplifying the audio signals processed by the audio processor 12, an internal speaker 14 for outputting the signals amplified by the amplifier 13 in the form of physical vibration, and an FM transmitter 15 for transmitting radio signals through an FM frequency when a selection is made so that radio signals are transmitted from the display system. The FM transmitter 15 is a part for transmitting audio signals to the external audio system in the form of radio audio signals through an FM frequency. At this point, a transmission FM frequency channel is controlled by the controller 17.

The video signal output block includes a video processor 20 for processing video signals received from the tuner 11 under control of the controller 17, a back-end system 21 for performing a back-end process such as deflection and scanning for video signals processed by the video processor 20, and a screen 22 for visually displaying outputted video signals.

Also, the video signal output block further includes a user interface 23 for a user to control functions of the display system and a memory 19 for storing information required for operating the display system.

The inventive display system further includes a radio signal antenna 25 for receiving FM frequency signals in a space where the display system is disposed and an FM detector 18 for detecting a transmission state of radio signals received from the radio signal antenna 25. The radio signal antenna 25 and the FM detector 18 are not essential elements and they can be used in the case where the display system needs to detect a transmission frequency that will be used by the FM transmitter 15. In other words, the FM detector 18 detects a frequency state of radio signals in the space where the display system 1 is disposed and can be used when a user manipulates the FM transmitter 15 using a frequency excluding the already used frequency channel being broadcasted.

Also, the external audio system includes an FM receiver 31 for receiving FM signals transmitted from the FM transmitter 15, a controller 30 (microprocessor) for controlling the external audio system on the whole, a memory 32 for storing information, and a speaker-out port 33 for outputting the signals received from the FM receiver 31 under control of the controller 30.

In operation, with power applied, audio signals selected by the tuner 11 are outputted through the audio signal output block, the video signals selected by the tuner 11 are outputted through the video signal output block. At this point, the audio signals are outputted through the internal speaker 14. When the RF signals are outputted as described above, a user manipulates an operation state of the display system using the user interface 23 so as to receive audio signals wirelessly and output the received signals through a separate external audio system.

Operation of the user interface 23 will be briefly described below. When a user manipulates the user interface 23 to control the controller 17, output signals of the audio processor 12 are outputted to the FM transmitter 15 and audio signals are transmitted wirelessly under control of the controller 17. After that, the FM receiver 31 of the external audio system receives the transmitted radio signals to output the received signals through the speaker-out port 33 of the external audio system. Here, the user interface 23 operates an on-screen display (OSD) processor 27 to have an OSD displayed on a screen 22 and a user controls an operation status of the display system using the outputted OSD.

The FM detector 18 detects a frequency of current radio signals to allow a user to select proper signals without interference.

FIG. 3 is a front view of a display system according to the present invention and FIG. 4 is a view of an OSD when an FM transmitter is selected in a display system of the present invention.

Referring to FIGS. 3 and 4, operations of a screen 41 on which video signals of the display system 1 are displayed and a key input unit 42 allowing for a user to manipulate an operation of the display system 1 is described in detail.

The key input unit 42 includes buttons for controlling a radio frequency transmission state of the FM transmitter 15 together with a general function button for manipulating a channel of the display system and the volume of an audio. In more detail, the key input unit 42 further includes a function button 44 for manipulating an operation state of the FM transmitter 15, a shift button 45 for changing a frequency selection when a manipulation function of the FM transmitter is selected, and a selection button 43 for selecting a desired frequency when the desired frequency is selected.

When a user selects the function button 44, the OSD is displayed as illustrated in FIG. 4 under control of the OSD processor 27. The OSD displays a radio transmission selector 51 for displaying an FM transmitter function is selected when the function button 44 is pressed, an on/off selector 53 displayed as a submenu of the radio transmission selector 51, a frequency selector 52 for displaying frequencies selectable by a user, and a selection pointer 54 for displaying a frequency currently selected by a user.

The selection pointer 54 is moved up and down by a user pushing the shift button 45 and a frequency displayed horizontally adjacent to a position where the selection pointer 54 is located represents a frequency transmitted by the FM transmitter 15. Therefore, a user manipulates the selection pointer 54 while manipulating the shift button 45. After a frequency having no interference is fixed, a user can fix a current frequency to a frequency that will be used in the FM transmitter 15 by pressing the selection button 43.

The above frequency selection process is a method of operating the display system of the present invention as observed from the viewpoint of a user. The process can be observed from the viewpoint of the internal operation of the display system as follows.

Audio/video signals inputted from the external apparatus are received by the tuner 11 and the received audio signals are processed by the audio processor 12.

At this point, the memory 19 stores available channels of FM frequency bands. When a user selects a predetermined channel using the shift button 45 and the selection button 43, the selected channel, which is the selected FM frequency band, is set to a use channel that will be actually used by the controller 17. That is, the controller 17 sets the use channel to a use channel that will be used by the FM transmitter 15.

After that, audio signals outputted from the audio processor 12 are transmitted to the external audio system through the use channel by the FM transmitter 15 and a user can listen to the audio signals outputted from the external audio system.

In that case, the tuner 11 can be used to receive broadcast signals transmitted from a broadcasting station. In the case where the external apparatus is other apparatus such as a DVD player, an input port for receiving audio signals from the DVD player can be used.

In the meantime, whether the radio transmission frequency currently used by the FM transmitter 15 has interference can be judged by having signals outputted from the FM detector 18 through a predetermined channel outputted through the internal speaker-out port 14 of the display system 1 and observing whether predetermined radio signals are outputted through the internal speaker 14. At this point, if predetermined radio signals are outputted through the internal speaker, it is judged that interference occurs. Resultantly, if radio signals are not outputted through the internal speaker 14 during the process of selecting a radio frequency, an available radio frequency without interference can be selected. In the case where the radio frequency of the FM transmitter 15 is selected during the above process, the sound source reproducing apparatus doesn't need to be manipulated separately.

For an alternative method, whether the radio transmission frequency has interference can be judged by setting a frequency of the FM receiver 31 to the radio frequency (frequency currently selected on the OSD) currently used by the FM transmitter 15 and observing RF signals outputted through the speaker-out port 33 or the external audio system. At this point, if predetermined radio signals are outputted through the speaker-out port 33, namely, predetermined radio signals are received in the FM receiver 31, it is judged that interference occurs. By the above process, an appropriate frequency may be selected.

The function of the FM detector 18 will be described below in more detail.

The FM detector checks a usable frequency band of a broadcasting station and an unused frequency band in an FM frequency band of an area where the display system is placed. For example, the FM detector 18 checks whether a carrier exists in a specific frequency band or not. The frequency band having no carrier is automatically considered as an unused channel. Of course, the user can directly check the unused channel and the usable channel by the audio outputted through the speaker, as described above.

When the current channel is the unused channel, the microprocessor 17 designates a plurality of channels among the unused channels as available channels and stores available channel information in the memory 19. Then, the microprocessor 17 controls the FM transmitter 15 to operate on a channel selected among the available channel. The user can listen to the audio outputted from the external audio system.

In this case, the tuner 11 can be used to receive RF signals transmitted wirelessly from the broadcasting station. When the external device is other device such as DVD player, the tuner 11 can be defined as an input port through which signals are inputted from the DVD player.

The on/off selector 53 allows the user to determine whether to select the function of the FM transmitter 15 or not. If the selection button is pressed in a state that the selection pointer 54 is placed in the on/off selector 53, the operating status of the FM transmitter 15 is toggled on and off.

In FIG. 4, seven available frequencies (87.7 MHz, 87.9 MHz, . . . , 88.9 MHz) are exemplarily displayed on the frequency selector 52 because the available frequency of the FM signal in Korea is 87.5-108.0 MHz. The frequencies have the interval of 200 MHz one another in order to prevent the interference between adjacent frequencies. Unlike Korea, since 65.00-74.00 MHz are used in Europe, it is preferable the frequencies are set suitably. Likewise, since 76.00-90.00 MHz are used in Japan, it is preferable that the frequencies are set suitably.

Although the frequency selector 52 uses the low frequency band, it can also use high frequency band (e.g., 106.7, 106.9, . . . , 107.9 MHz) according to the positions of the display system. That is, the frequencies can be changed according to the areas where the product will be used.

FIG. 5 is a flowchart of an FM signal transferring method in the display system according to the present invention. A procedure of selecting a frequency when watching a broadcasting program on the display system in a wireless way will be described in detail with reference to FIG. 5.

Referring to FIG. 5, the usable channels and the unused channels of the FM frequency band in the area where the display system is placed are selected (S11). The information on the channels unused currently in the broadcasting station is transferred to the microprocessor 17 (S12). As described above, the selecting operation can be performed in various manners. At this time, the number of the unused channels may be in plurality.

The microprocessor 17 stores the unused channels in the memory 19 (S13), and selects a specific available channel among the stored unused channels (S14). The operation of selecting the channels to be currently used can be performed in various methods.

The information on the available channels is transferred to the FM transmitter 15 (S15) and the selected channels are set as the available channel to be used by the FM transmitter 15 (S16). When the FM transmitter 15 operates, the audio signal is transferred through the specific channel, such that the user can listen to the audio through the external audio system.

The method of setting th RF transmission frequency of the FM transmitter in the display system itself and the method of setting the RF transmission frequency of the FM transmitter in association with the display system and the external audio system have been described. However, the present invention is not limited to these methods. That is, the RF transmission frequency can be set by a remote controller used in a general display system. This method will be described below in detail.

Figure 6:
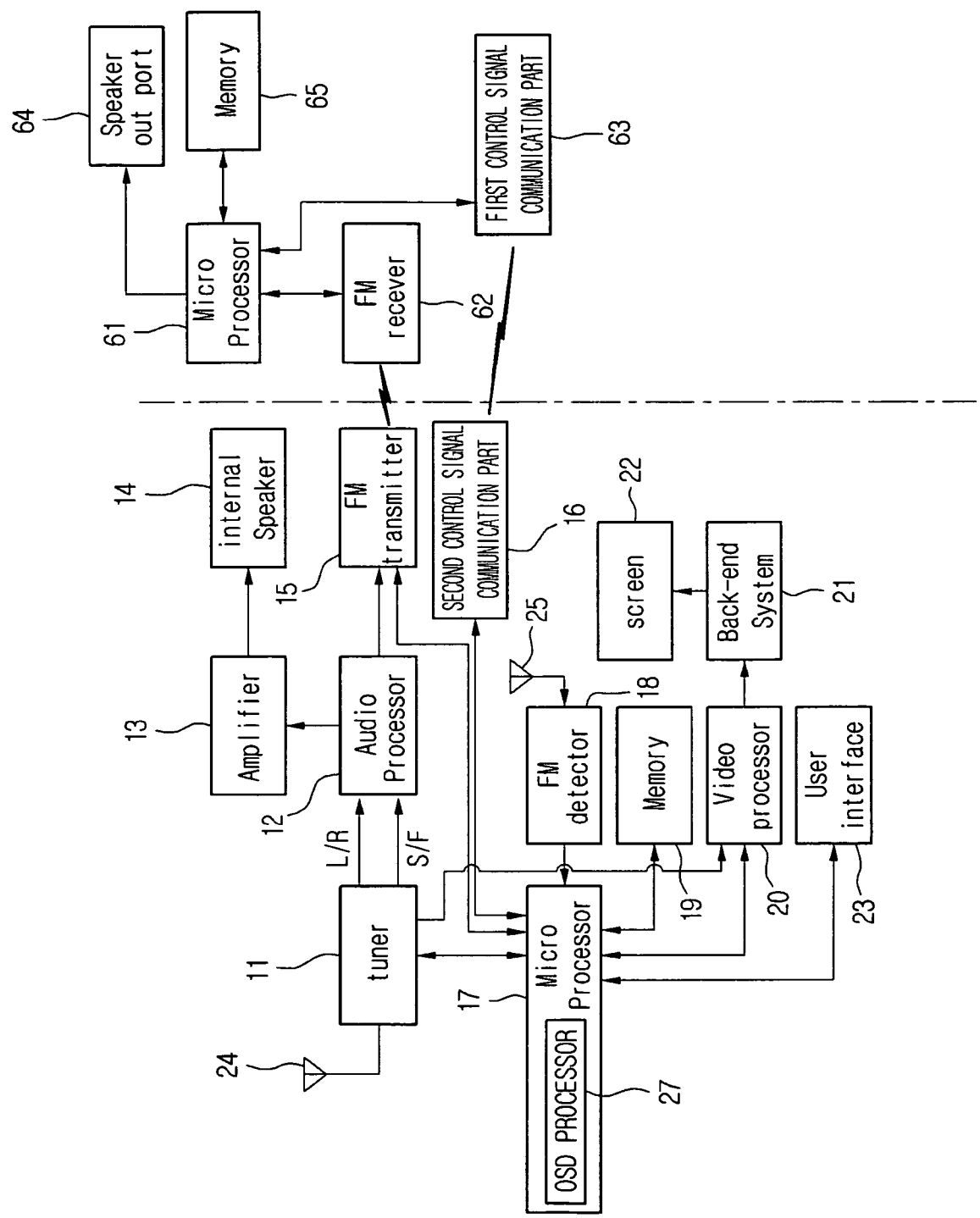
FIG. 6 is a block diagram of a display system according to another embodiment of the present invention.

FIG. 6 is a block diagram of a display system according to another embodiment of the present invention.

Referring to FIG. 6, this embodiment is almost equal to the display system shown in FIG. 2. A difference is that a second control signal communication part 16 and a first control signal communication part 63 are further included in the display system 1 and the remote controller 2, thereby providing an infrared transmission between the display system 1 and the remote controller 2.

The control signal communication parts 16 and 63 are blocks that transfer the control signal between the display system and the remote controller. The control signal communication parts 16 and 63 may be an IR module for infrared communication, a Bluetooth module, an IEEE802.11b module.

In FIG. 6, the same reference numerals as in FIG. 2 are used to refer to the same elements. A detailed description about the replicated elements will be omitted for conciseness.

Figure 7:
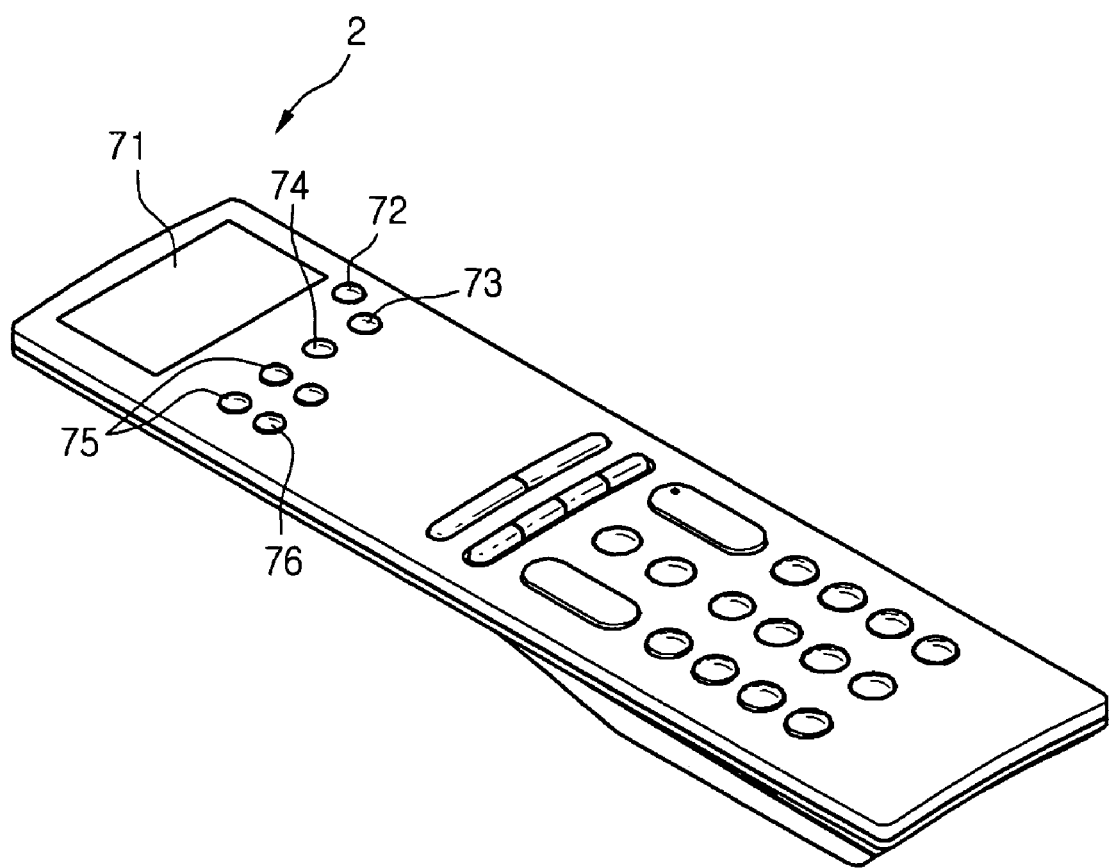
FIG. 7 is a perspective view of the remote controller used in the display system according to the present invention.

FIG. 7 is a perspective view of the remote controller used in the display system according to the present invention.

Referring to FIG. 7, the remote controller 2 includes a display unit 71, an FM reception button 72, and a frequency adjusting button 76. The display unit 71 is configured to display the operating status of the remote controller. The FM reception button 72 controls the reception function of the radio frequency signal transmitted from the FM transmitter 15. The frequency adjusting button 76 adjusts the FM frequency.

Like the display system, the remote controller 2 includes a selection button 73, a function button 74, and a shift button 75.

The operation of adjusting the RF transmission frequency of the FM transmitter 15 by moans of the remote controller 2 will be described below with reference to FIGS. 6 and 7.

When the FM reception button 72 is in off-state, the remote controller 2 operates a normal function of, for example, adjusting a volume of the display system. When the FM reception button 72 is in on-state, the remote controller 2 adjusts the transmission status of the radio audio signal in the display system. Then, a plurality of devices capable of receiving the radio signal starts to operate. Only when the FM reception button is pressed, the radio reception function is enabled. Therefore, the power of the remote controller can be saved.

The subsequent operations of the display system and the audio system are equal to the above-described operations. Then, the menu is displayed on the OSD such that the transmission frequency of the FM transmitter 15 can be adjusted using the function button 74. While watching the OSD, the user selects the appropriate frequency using the shift button 75, and adjusts the reception frequency status of the FM receiver 62 using the frequency adjusting button 76 of the remote controller 2.

When the radio signal does not exist in the current selected frequency, this means that the radio signal coinciding with the transmission frequency does not exist. Therefore, the current radio frequency is selected as the usable frequency of the FM transmitter 15 by means of the selection button 73.

Although not described in detail, it is apparent that the adjustment of the OSD by means of the remote controller 2 is performed by the control signal communication parts 16 and 63 of the each device.

As described above, when the display system is controlled using the remote controller 2, the user can easily change the radio frequency of the broadcasting from the display system even at a remote place.

FIG. 8 is a flowchart of an FM signal transferring method in a display system according to another embodiment of the present invention.

Referring to FIG. 8, at least one channel is selected from the FM frequency band of the reception area (S21). At least one of the selected channels is stored as the available channel (S22).

The channels can be previously set by the producer of the display system. Also, as described above, various methods can be used to directly set the channels to the display system. In the case where the channels are previously set by the user, seven channels can be allocated as described above.

Then, the control signal is inputted from the remote controller 2 (S23). Here, the control signal can be inputted to the display system by the procedure of transmitting it to the first control signal communication part 63 operating as the control signal transmitter 63 and then receiving it at the second signal communication part 16 operating as the control signal receiver 16.

Next, the information on the specific channel among the available channels stored in the memory is selected (S24). As described above, various methods or combination thereof can be applied to the operation of selecting the specific channel. The channel information on the selected channel is transmitted to the FM transmitter (S25), and the FM transmitter sets the corresponding channel as the transfer channel (S26).

Thereafter, the audio signal of the display system is transmitted to the remote controller through the FM signal over the transfer channel, such that the user can listen to the audio through the remote controller (S27).

The present invention can be modified in various manners. For example, instead of setting the radio transmission frequency of TV and then the reception frequency of the remote controller, the reception frequency is set to a predetermined frequency by the remote controller and the appropriate frequency is found by the operation of checking the interference of the incoming frequency. In this manner, the radio transmission frequency of the display system can be adjusted to the corresponding frequency.

Also, after setting the frequency having no interference in the remote controller 2, the frequency set currently in the remote controller is transmitted to the display system 1 and the specific frequency transmitted is set as the frequency that will be wirelessly transmitted in the display system.

Further, the signals transmitted from the FM transmitter 15 are simultaneously transmitted to both the audio system 3 and the remote controller 2 and thus the audio is outputted simultaneously, thereby improving the user's convenience.

According to the present invention, the user can listen to the audio of the display system using the external audio system, not the display system itself.

Also, the frequencies used in both the display system and the audio system can be set easily without any interference. Frequencies of other devices can be controlled conveniently, centering on the display system.

Further, the frequency can be changed when there occurs the interference with the specific frequency, thereby improving the reliability of products and the user convenience.

Furthermore, since other electronic devices that can receive the FM signals are usually placed near the display system, the audio signals may be heard in various types. The frequency can be adjusted on the OSD of the display system, thereby improving user convenience much more.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A display system for transmitting FM signals to an external audio system having an FM reception function, the display system comprising:

a tuner for receiving an RF signal and dividing the RF signal into a video signal and an audio signal;

an audio processor for receiving the audio signal from the tuner;

an FM detector for searching usable channels or unused channels from among FM frequency bands of a reception area and transmitting information on the unused channels;

a microprocessor for setting at least one of the unused channels as an available channel, the unused channels being provided from the FM detector, and the microprocessor controlling an internal speaker of the display system to output an audio signal on the available channel;

a memory for storing the available channel under control of the microprocessor; and an FM transmitter for receiving the audio signal from the audio processor and transmitting the audio signal over at least one channel selected from among the channels stored in the memory under control of the microprocessor, wherein the microprocessor can determine the available channel without interference by monitoring the audio signal on the available channel from the internal speaker.

2. A display system for transmitting FM signals to an external audio system having an FM reception function, the display system comprising:

an audio input unit for receiving an audio signal from an external device;

an audio processor for receiving the audio signal from the audio input unit;

an FM detector for searching usable channels or unused channels from among FM frequency bands of a reception area and transmitting information on the unused channels;

a microprocessor for setting at least one of the unused channels as an available channel, the unused channels being provided from the FM detector, and the microprocessor controlling an internal speaker of the display system to output an audio on the available channel;

a memory for storing the available channel under control of the microprocessor; and an FM transmitter for receiving the audio signal from the audio processor and transmitting the audio signal over at least one channel selected from among the channels stored in the memory under control of the microprocessor, wherein the microprocessor can determine the available channel without interference by monitoring the audio on the available channel from the internal speaker.

3. A display system for transmitting FM signals to an external audio system having an FM reception function, the display system comprising:

a tuner for receiving an RF signal and dividing the RF signal into a video signal and an audio signal;

an audio processor for receiving the audio signal from the tuner;

a memory for storing at least one channel from among FM frequency bands of a reception area;

a user interface for selecting one channel from among at least one or more channels previously stored in the memory by a user;

a microprocessor for reading the channel selected from the memory according to the channel selected from the user interface, and setting the read channel as an available channel, and the microprocessor controlling an internal speaker of the display system to output audio on the available channel; and an FM transmitter for receiving the audio signal from the audio processor and transmitting the audio signal over the available channel selected among the at least one or more channels stored in the memory under control of the microprocessor, wherein the microprocessor can determine the available channel without interference by monitoring the audio on the available channel from the internal speaker.

4. A display system for transmitting FM signals to an external audio system having an FM reception function, the display system comprising:

an audio input unit for receiving an audio signal from an external device;

an audio processor for receiving the audio signal from the audio input unit;

a memory for storing at least one channel from among FM frequency bands of a reception area;

a user interface for selecting one channel from among at least one or more channels previously stored in the memory by a user;

a microprocessor for reading the channel selected from the memory according to the channel selected from the user interface, and setting the read channel as an available channel, and the microprocessor controlling an internal speaker of the display system to output an audio on the available channel; and an FM transmitter for receiving the audio signal from the audio processor and transmitting the audio signal over the available channel selected from among the at least one or more channels stored in the memory under control of the microprocessor, wherein the microprocessor can determine the available channel without interference by monitoring the audio on the available channel from the internal speaker.

5. The display system according to claim 2 or 4, wherein the external device is a device that is capable of outputting the audio signal, and the external device includes a DVD player, a VCR, a set-top box, a PC, a game system, or a camcorder.

6. A display system comprising:

a remote controller including a key input unit for allowing a user to select an available channel, a control signal transmitter for transmitting a control signal according to a user's key input, and an FM receiver for selecting an FM signal of the selected available channel;

a tuner for receiving an RF signal and dividing the RF signal into a video signal and an audio signal;

an audio processor for receiving the audio signal from the tuner;

a memory for storing at least one channel from among FM frequency bands of a reception area;

a control signal receiver for receiving the control signal from the control signal transmitter of the remote controller;

a microprocessor for reading the channel selected from the memory according to the control signal received from the control signal receiver, and setting the read channel as an available channel, and the microprocessor controlling an internal speaker of the display system to output an audio on the available channel; and an FM transmitter for receiving the audio signal from the audio processor and transmitting the audio signal to the FM receiver over the available channel selected from among the at least one or more channels stored in the memory under control of the microprocessor, wherein the microprocessor can determine the available channel without interference by monitoring the audio on the available channel from the internal speaker.

7. The display system according to claim 6, further comprising:
an OSD processor for creating a menu for allowing the user to watch and select the at least one channel previously stored in the memory under control of the microprocessor; and
a display unit for displaying the menu.

8. The display system according to claim 6, wherein the control signal transmitter and the control signal receiver are an IR module.

9. The display system according to claim 6, wherein the control signal transmitter and the control signal receiver are a Bluetooth module.

10. The display system according to claim 6, wherein the control signal transmitter and the control signal receiver are an IEEE802.11b module.

11. The display system according to claim 6, wherein the remote controller further includes a speaker out port.

12. An FM signal transferring method for use in a display system for transmitting FM signals to an external audio system having an FM reception function, the FM signal transferring method comprising:
selecting usable channels or unused channels in FM frequency bands of a reception area;
transmitting information of the selected unused channels to a microprocessor;
storing at least one or more unused channels in a memory by using the transmitted information of the unused channels;
selecting one available channel from among the at least one or more unused channels stored in the memory;
controlling an internal speaker of the display system to output an audio on the available channel;
transmitting information of the selected available channel to an FM transmitter or an available channel without interference determined by monitoring the audio on the available channel from the internal speaker;
selecting a transfer channel of the FM transmitter by using the transmitted information of the available channel or the available channel without interference; and
transmitting an audio signal of the display system to the external audio system over the selected transfer channel.

13. The FM signal transferring method as recited in claim 12, wherein selecting the usable channels or the unused channels includes:
removing the usable channels from among the FM frequency bands of the reception area;
searching available unused channels in the band where the usable channels are removed, depending on interference degree of an output audio of the display system; and
setting at least one or more channels from among the searched unused channels according to priority.

14. The FM signal transferring method as recited in claim 12, wherein selecting the usable channels or the unused channels includes:
removing the usable channels from among the FM frequency bands of the reception area;
searching available unused channels in the band where the usable channels are removed, depending on interference degree of an input audio of the remote controller; and
setting at least one or more channels from among the searched unused channels according to priority.

15. An FM signal transferring method for use in a display system for transmitting FM signals to a remote controller having an FM signal reception function, the FM signal transferring method comprising:
controlling an internal speaker of the display system to output an audio on the available channel;
selecting at least one or more channels in FM frequency bands of a reception area;
storing at least one or more channels of the selected channels as available channels in a memory;
reading information on one of the available channels stored in the memory according to a control signal outputted from the remote controller or an available channel without interference determined by monitoring the audio on the available channel from the internal speaker;
transmitting the read information on the available channel or the available channel without interference to an FM transmitter;
setting a transfer channel of the FM transmitter according to the control signal; and
transmitting an audio signal of the display system to the remote controller having the FM signal reception function over the selected transfer channel.

* * * * *